(12) United States Patent
Chen et al.

(10) Patent No.: US 8,685,830 B2
(45) Date of Patent: Apr. 1, 2014

(54) METHOD OF FILLING SHALLOW TRENCHES

(71) Applicant: Shanghai Hua Nec Electronics Co., Ltd., Shanghai (CN)

(72) Inventors: Fan Chen, Shanghai (CN); Xiongbin Chen, Shanghai (CN); Kai Xue, Shanghai (CN); Keran Zhou, Shanghai (CN); Jia Pan, Shanghai (CN); Hao Li, Shanghai (CN); Yongcheng Wang, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/705,437

(22) Filed: Dec. 5, 2012

(65) Prior Publication Data

US 2013/0143386 A1    Jun. 6, 2013

(30) Foreign Application Priority Data

Dec. 5, 2011    (CN) .......................... 2011 1 0398277

(51) Int. Cl.
*H01L 21/76*    (2006.01)
*H01L 21/762*    (2006.01)

(52) U.S. Cl.
CPC .......... *H01L 21/76* (2013.01); *H01L 21/76224* (2013.01); *H01L 21/76283* (2013.01)
USPC .............. 438/425; 257/E21.54; 257/E21.545; 257/E21.628; 257/E21.642; 438/196; 438/219; 438/221; 438/248; 438/295; 438/296; 438/355; 438/359; 438/391; 438/404

(58) Field of Classification Search
CPC .............. H01L 21/76; H01L 21/76224; H01L 21/76283
USPC ......... 438/196, 219, 221, 248, 295, 296, 355, 438/359, 391, 404, 424, 425; 257/E21.54, 257/E21.545, E21.628, E21.642
See application file for complete search history.

(56) References Cited

U.S. PATENT DOCUMENTS

| | | | |
|---|---|---|---|
| 2007/0293017 A1* | 12/2007 | Yang | 438/424 |
| 2008/0242045 A1* | 10/2008 | Lee et al. | 438/435 |
| 2009/0020845 A1* | 1/2009 | Shin et al. | 257/506 |
| 2011/0012226 A1* | 1/2011 | Lee | 257/510 |
| 2011/0027966 A1* | 2/2011 | Lee | 438/438 |
| 2012/0104539 A1* | 5/2012 | Mehrotra | 257/506 |
| 2012/0104540 A1* | 5/2012 | Mehrotra | 257/506 |

* cited by examiner

*Primary Examiner* — Asok K Sarkar
(74) *Attorney, Agent, or Firm* — MKG, LLC

(57) ABSTRACT

A method of filling shallow trenches is disclosed. The method includes: successively forming a first oxide layer and a second oxide layer over the surface of a silicon substrate where shallow trenches are formed in; etching the second oxide layer to form inner sidewalls with an etchant which has a high etching selectivity ratio of the second oxide layer to the first oxide layer; growing a high-quality pad oxide layer by thermal oxidation after the inner sidewalls are removed; and filling the trenches with an isolation dielectric material. By using this method, the risk of occurrence of junction spiking and electrical leakage during a subsequent process of forming a metal silicide can be reduced.

9 Claims, 4 Drawing Sheets

METHOD OF FILLING SHALLOW TRENCHES

CROSS-REFERENCES TO RELATED APPLICATIONS

This application claims the priority of Chinese patent application number 201110398277.0, filed on Dec. 5, 2011, the entire contents of which are incorporated herein by reference.

TECHNICAL FIELD

The present invention relates to the fabrication of semiconductor integrated circuits, and more particularly, to a method of filling shallow trenches.

BACKGROUND

Shallow trench isolation (STI) is a commonly used process consisted of three main steps, namely, etching, filling and planarizing. In a general case, a mask layer is first formed on the surface of a substrate and thereafter is used as an etching mask to form one or more trenches in the substrate. Next, a pad oxide layer for protecting the substrate from being damaged during a subsequent step of filling the trenches is formed over the inner surface (including the bottom face and two side faces) of each trench before the trenches are filled. Then a planarization or etching method is employed to remove the mask layer after the trenches are filled.

In some applications of the STI process, such as that in the formation of a silicon-germanium (SiGe) heterojunction bipolar transistor (HBT), the STI process may further include a step of forming inner sidewalls over the side faces of each trench after the formation of the trenches. These inner sidewalls can serve as barriers to prevent ions from entering the underlying portions of the silicon substrate on both sides of the trenches during a subsequent step of ion implantation for forming pseudo buried layers under the bottoms of the trenches. After the ion implantation step, these inner sidewalls are removed followed by steps of filling and planarizing the shallow trenches.

The foregoing "inner-sidewalls-involved" STI process will at least include a dry etching step for forming the inner sidewalls, a wet etching step for removing the inner sidewalls and another wet etching step for removing the mask layer. During these dry and wet etching steps, there may be damages to the pad oxide layer and even to the underlying silicon, which will lead to significant electrical leakage, or crystal defects after a high temperature treatment. Such crystal defects may further lead to failure of the device.

FIG. 1 is a schematic representation of device defects generated after an inner-sidewalls-involved STI process is carried out according to the prior art. As shown in the figure, due to the corrosion of the wet etching step of the STI process, obvious damages are present in boundary portions of the pad oxide layer 3 where the shallow trench 2 and the top surface of the silicon substrate 1 contact with each other. As a result, during the subsequent step of forming a metal silicide on the top surface of the silicon substrate 1, a portion of the silicide 4 (as indicated by the dash-line circles in FIG. 1) grows downward into the boundary portions of the pad oxide layer 3. This portion of the silicide may spike the below pn junction and cause a high leakage current.

SUMMARY OF THE INVENTION

The present invention addresses the above mentioned issues encountered in the prior art by presenting a novel inner-sidewalls-involved method of filling shallow trenches. The method is able to reduce the occurrence of junction spiking and lower the leakage current around where shallow trenches contact with the top surface of the silicon substrate.

To achieve the above objective, the method of filling shallow trenches of the present invention includes:

providing a silicon substrate, the silicon substrate having a mask layer formed thereon;

etching the silicon substrate to form one or more shallow trenches therein;

depositing a first oxide layer, which serves as a first pad oxide layer, over surface of the silicon substrate;

depositing a second oxide layer over surface of the silicon substrate;

etching the second oxide layer by using a dry etch-back process to form inner sidewalls in the one or more trenches, wherein the dry etch-back process has a high etching selectivity ratio of the second oxide layer to the first oxide layer, such that the first oxide layer is remained after the dry etch-back process;

removing the inner sidewalls by using a wet etching process, wherein the first pad oxide layer is simultaneously removed by the wet etching process so that the underlying silicon is exposed in each of the one or more trenches;

growing a silicon dioxide layer, which serves as a second pad oxide layer, over a surface of each of the one or more trenches by thermal oxidation of the exposed underlying silicon; and filling the one or more trenches with an isolation dielectric material.

According to an embodiment, the first oxide layer is a non-doped silicon dioxide layer, and the second oxide layer is a heavily N-doped silicon dioxide layer.

According to an embodiment, after the step of filling the trenches with an isolation dielectric material, the method further includes:

removing the mask layer to expose the underlying silicon; and forming a metal silicide in regions where silicon is exposed.

By using the method of the present invention, the risk of occurrence of junction spiking and electrical leakage during the process of forming the metal silicide can be reduced due to the following beneficial effects of the invention.

Firstly, the dry etch-back process for etching the heavily N-doped silicon dioxide layer to form inner sidewalls has a high etching selectivity ratio of the heavily N-doped silicon dioxide material to the non-doped silicon dioxide material, such that the non-doped silicon dioxide layer is almost completely remained after the dry etch-back process, and the underlying silicon is protected from being damaged before the step of thermal oxidation.

Secondly, compared with the first pad oxide layer, the second pad oxide layer is formed by a thermal oxidation process. As the silicon is protected from being damaged before the step of growing a silicon dioxide layer by thermal oxidation, this ensures a high quality of the second pad oxide layer and hence enables it to withstand a subsequently adopted wet etching process for removing the mask layer.

DETAILED DESCRIPTION

An inner-sidewalls-involved method of filling shallow trenches according to an embodiment of the present invention will be specified and described below.

Figure 1:
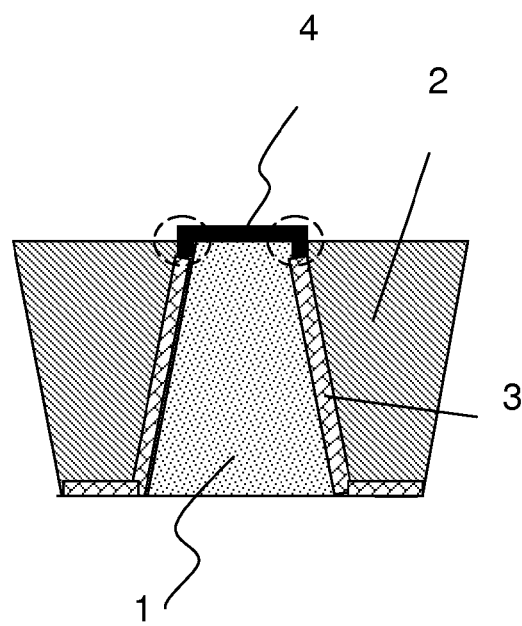
FIG. 1 is a schematic representation of device defects generated after an inner-sidewalls-involved STI process is carried out according to the prior art.
Figure 2A:
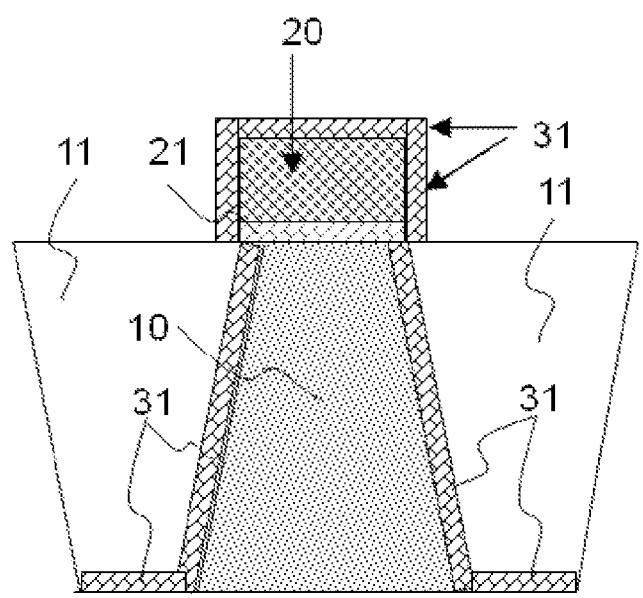
FIGS. 2a to 2g are cross-sectional views illustrating steps of an inner-sidewalls-involved method of filling trenches constructed according to the present invention.

As shown in FIG. 2a, in a first step, one or more trenches 11 are formed in a silicon substrate 10 by an etching process, and after that, a non-doped silicon dioxide layer, which serves as a first pad oxide layer 31, is deposited entirely covering the top surface of the etched silicon substrate.

In this step, the etching process for forming the trenches may have the same steps with, for example, the shallow trench isolation (STI) process. Specifically, it includes the steps of: growing a silicon dioxide layer, which serves as an isolation oxide layer 21, over a surface of the silicon substrate 10 by thermal oxidation; depositing a silicon nitride layer over the isolation oxide layer 21 and forming a patterned silicon nitride mask layer 20 by etching the silicon nitride layer and the isolation oxide layer; and then etching the silicon substrate 10 by using the patterned silicon nitride mask layer 20 as a mask to form the trenches 11 in the silicon substrate 10.

The first pad oxide layer 31 may have a thickness of, for example, 100 Å to 300 Å, and may be deposited by, for example, sub-atmospheric chemical vapor deposition (SACVD), at a temperature of, for example, 300° C. to 500° C. Due to its high step coverage, the first pad oxide layer 31 is deposited over the silicon substrate 10 with a relatively uniform thickness in any direction.

Figure 2B:
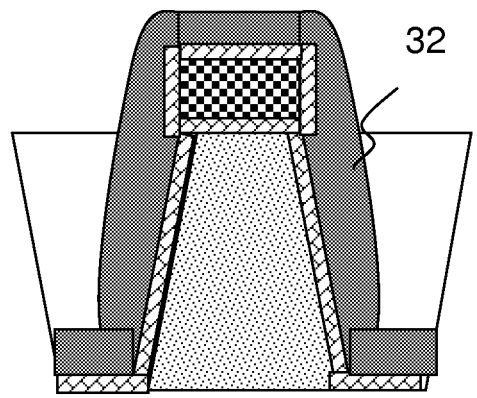

Next, as shown in FIG. 2b, in a second step, a heavily N-doped silicon dioxide layer 32 is deposited entirely over the top surface of the first pad oxide layer 31 by, for example, SACVD. The silicon dioxide layer 32 may be doped with phosphorus, arsenic, antimony, or other N-type impurities, and may have a doping concentration of, for example, 4% to 8% by weight and a thickness of, for example, 300 Å to 1000 Å.

Figure 2C:
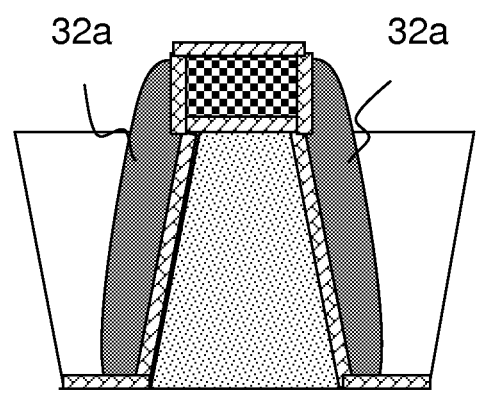

After that, as shown in FIG. 2c, in a third step, the heavily N-doped silicon dioxide layer 32 deposited in the second step is etched by using a dry etch-back process until the underlying first pad oxide layer 31 is reached, such that inner sidewalls 32a are formed in the trenches 11.

The dry etch-back process in this step can be controlled by taking advantage of its high etching selectivity ratio of the heavily N-doped silicon dioxide layer 32 to the non-doped silicon dioxide layer 31. That is, as the dry etch-back process has a high etching rate to the heavily N-doped silicon dioxide layer 32 while has a low etching rate to the non-doped silicon dioxide layer 31, it is easy to control the process to stop at a targeted point. With this non-doped silicon dioxide layer 31 acting as a barrier layer, the dry etch-back process will always stop at the top surface of the first pad oxide layer 31 rather than further proceed to damage the underlying silicon substrate.

The non-doped silicon dioxide deposited in the first step and the heavily N-doped silicon dioxide deposited in the second step are used to exemplarily describe preferred materials for carrying out the present invention merely, and are not intended to limit this invention to these materials. Those skilled in this art may use any other materials as long as they meet the requirement that the dry etch-back process adopted in the third step has a high etching selectivity ratio of the material deposited in the second step to form the inner sidewalls with respect to the material deposited in the first step to form the first pad oxide layer such that it is ensured that the first pad oxide layer is completely remained or almost completely remained after the dry etch-back process.

After this third step, those processes relying on the protection of inner sidewalls 32a may be carried out, for example, the process of ion implantation into the bottoms of the trenches in the fabrication of a silicon-germanium (SiGe) heterojunction bipolar transistor (HBT).

Figure 2D:
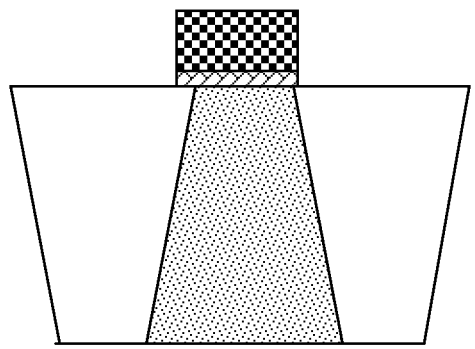

As shown in FIG. 2d, in a fourth step, remove the inner sidewalls 32a by a wet etching process. Without being protected by a barrier layer, the first pad oxide layer 31 deposited over side faces and bottom faces of the trenches 11 and top face and side faces of the silicon nitride mask layer 20 will also be removed in this step. After this step, the silicon initially covered by the first pad oxide layer 31 will be exposed.

Figure 2E:
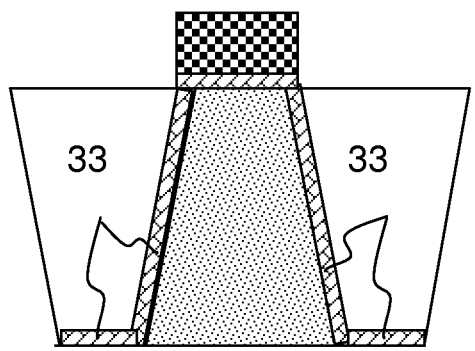

Next, as shown in FIG. 2e, in a fifth step, a silicon dioxide layer, which serves as a second pad oxide layer 33, is grown by thermal oxidation of the exposed silicon over bottom face and side faces of each of the trenches.

The second pad oxide layer 33 has a thickness of, for example, 100 Å to 200 Å, and is formed by thermal oxidation at a temperature of, for example, 800° C. to 1150° C. The second pad oxide layer 33 plays two main roles as follows: 1) it repairs any possible damages made during the etching process to form the trenches and hence reduces the risk of occurrence of electrical leakage within the device; 2) it protects the silicon surface from being damaged by plasma bombardment in a subsequent high-density plasma chemical vapor deposition (HDP CVD) process for filling silicon dioxide into the trenches 11.

Having been protected by the first pad oxide layer 31, the underlying silicon is not damaged before this step. Therefore, the second pad oxide layer 33 grown by thermal oxidation in this step has a high quality and thus a high capacity to withstand a subsequent wet etching process.

Figure 2F:
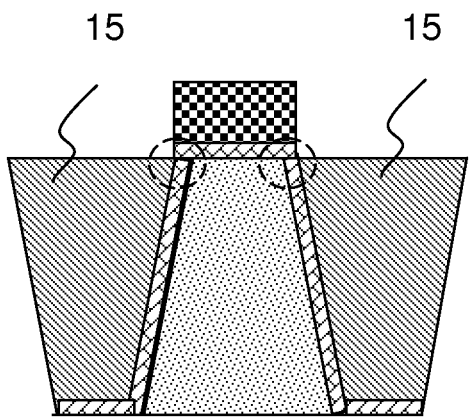

After that, as shown in FIG. 2f, in a sixth step, silicon dioxide 15 is filled into the trenches 11 by optionally using, for example, an HDP CVD process.

In this step, although portions of the second pad oxide layer 33 around where (as indicated by the dash-line circles in FIG. 2f) shallow trenches 11 contact with the top surface of the silicon substrate 10 will also be bombarded by plasma, due to the high quality of the second pad oxide layer 33, none serious damage will be caused to these portions.

Figure 2G:
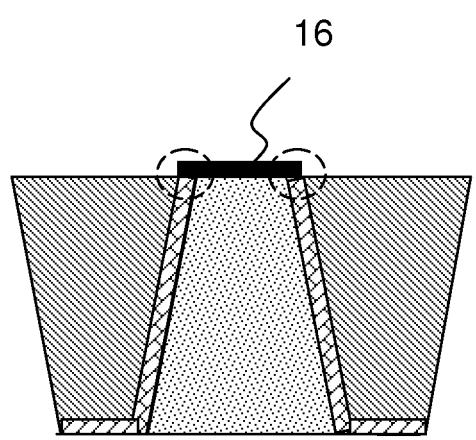

Next, as shown in FIG. 2g, in a seventh step, the silicon nitride mask layer 20 is removed, and then in each region where the underlying silicon is exposed thereby, a metal silicide 16 is formed.

In this step, the silicon nitride mask layer 20 may be removed optionally by, for example, a wet etching process which will simultaneously remove the isolation oxide layer 21 under the silicon nitride mask layer 20 to expose the silicon under the isolation oxide layer 21.

The formation of the metal silicide 16 on surface of the silicon substrate 10 includes: depositing a refractory metal on surface of the silicon substrate 10 where the silicon is exposed; and forming the metal silicide 16 through a high-temperature annealing process.

In this step, the wet etching process for removing the silicon nitride mask layer 20 also has a corrosive effect to the second pad oxide layer 33, but because the second pad oxide layer 33 is formed by thermal oxidation and thus has a high capacity to withstand the wet etching process, boundary portions of the second pad oxide layer 33 around where (as indicated by the dash-line circles in FIG. 2g) shallow trenches 11 contact with the top surface of the silicon substrate 10 will have a smaller loss compared to the prior art. Therefore, the metal silicide 16 formed in the subsequent step is mainly located on the surface of the silicon substrate 10, and is not grown downward into the boundary portions of the second pad oxide layer 33. Thus, the risk of occurrence of junction spiking and electrical leakage will be reduced.

While preferred embodiments have been presented in the foregoing description of the invention, they are not intended to limit the invention in any way. Those skilled in the art can make various modifications and variations without departing from the spirit or scope of this invention. Thus, it is intended that the present invention covers all such modifications, alternatives and variations.

What is claimed is:

1. A method of filling shallow trenches, the method comprising the steps of:
    providing a silicon substrate, the silicon substrate having a mask layer formed thereon;
    etching the silicon substrate to form one or more shallow trenches therein;
    depositing a first oxide layer, which serves as a first pad oxide layer, over surface of the silicon substrate;
    depositing a second oxide layer over surface of the silicon substrate;
    etching the second oxide layer by using a dry etch-back process to form inner sidewalls in the one or more trenches, wherein the dry etch-back process has a high etching selectivity ratio of the second oxide layer to the first oxide layer, such that the first oxide layer is remained after the dry etch-back process;
    removing the inner sidewalls by using a wet etching process, wherein the first pad oxide layer is simultaneously removed by the wet etching process so that the underlying silicon is exposed in each of the one or more trenches;
    growing a silicon dioxide layer, which serves as a second pad oxide layer, over a surface of each of the one or more trenches by thermal oxidation of the exposed underlying silicon; and
    filling the one or more trenches with an isolation dielectric material.

2. The method according to claim 1, wherein a shallow trench isolation process is adopted to etch the silicon substrate to form the one or more shallow trenches.

3. The method according to claim 1, wherein the first oxide layer is a non-doped silicon dioxide layer, and the second oxide layer is a heavily N-doped silicon dioxide layer.

4. The method according to claim 3, wherein the non-doped silicon dioxide layer has a thickness of 100 Å to 300 Å and is formed by sub-atmospheric chemical vapor deposition at a temperature of 300° C. to 500° C.

5. The method according to claim 3, wherein the heavily N-doped silicon dioxide layer has a thickness of 300 Å to 1000 Å and a doping concentration of 4% to 8% by weight.

6. The method according to claim 1, wherein the thermal oxidation is conducted at a temperature of 800° C. to 1150° C., and the second pad oxide layer formed by the thermal oxidation has a thickness of 100 Å to 200 Å.

7. The method according to claim 1, wherein the isolation dielectric material is silicon dioxide, and is filled by a high-density plasma chemical vapor deposition process.

8. The method according to claim 1, further comprising a step of forming a metal silicide after the step of filling the one or more trenches with an isolation dielectric material.

9. The method according to claim 8, wherein the step of forming a metal silicide includes:
    removing the mask layer by wet etching so as to expose the underlying silicon;
    depositing a refractory metal in regions where the underlying silicon is exposed; and
    performing a high-temperature annealing process to form the metal silicide.

* * * * *